United States Patent [19]
Hagner

[11] Patent Number: 5,829,127
[45] Date of Patent: Nov. 3, 1998

[54] LATTICEWORK WITH PLURALITY OF OVERLYING LINES

[75] Inventor: George R. Hagner, Coronado, Calif.

[73] Assignee: Circuitronics, Inc., Colorado Springs, Colo.

[21] Appl. No.: 668,858

[22] Filed: Jun. 24, 1996

[51] Int. Cl.⁶ .............................. H05K 3/36; H05K 3/02
[52] U.S. Cl. .............................. 29/846; 29/830; 29/848; 72/324; 174/262
[58] Field of Search ............................. 29/830, 846, 848, 29/852, 827; 174/250, 253, 262, 264, 261; 156/902; 72/55, 324

[56] References Cited

U.S. PATENT DOCUMENTS

| | | | |
|---|---|---|---|
| 2,753,619 | 7/1956 | Franklin | 29/846 |
| 3,678,577 | 7/1972 | Weglin et al. | 29/848 |
| 3,911,716 | 10/1975 | Weglin | 72/324 |
| 4,356,627 | 11/1982 | Hoffman | 29/849 |
| 4,363,930 | 12/1982 | Hoffman | 174/68.5 |
| 4,869,767 | 9/1989 | Robinson et al. | 156/233 |
| 4,985,601 | 1/1991 | Hagner | 174/261 |
| 5,046,238 | 9/1991 | Daigle et al. | 29/830 |
| 5,068,712 | 11/1991 | Murakami et al. | 357/72 |
| 5,274,912 | 1/1994 | Olenick et al. | 29/830 |
| 5,309,629 | 5/1994 | Traskos et al. | 29/830 |
| 5,329,695 | 7/1994 | Traskos et al. | 29/830 |
| 5,378,581 | 1/1995 | Vernon | 29/846 |
| 5,401,913 | 3/1995 | Gerber et al. | 174/264 |
| 5,701,031 | 12/1997 | Oguchi et al. | 257/686 |

*Primary Examiner*—W. Donald Bray
*Attorney, Agent, or Firm*—Sheridan Ross P.C.

[57] ABSTRACT

A circuit board fabrication method and system is disclosed in which circuit boards are fabricated by adhesively applying circuit conductive traces to a circuit board substrate and subsequently affixing the arrangement of the circuit traces on the substrate by encapsulating and embedding the circuit traces within a circuit board covering material that becomes flowable and adhesive when subjected to heat and pressure. The circuit traces are created and applied to circuit board substrate areas by a punch and die assembly. A laminated sheet of circuit trace material is provided between plates of the apparatus wherein the plates have matching circuit trace shaped cutouts. Punch elements having a mating circuit trace shape are slidable within the cut-outs wherein a circuit trace is punched from the circuit trace material when the punch elements slide between the plates. After a circuit trace is punched, the punch elements then stamp the circuit trace to the substrate. Since the circuit trace material is a sheet laminate having at least a conductor, a dielectric or insulator and a bottommost adhesive film, the circuit traces adhesively bind to the substrate during the stamping process. Further, the dielectric layer allows such circuit traces to be iteratively stamped on top of one another substantially without concern for electrical interference at circuit trace overlaps.

23 Claims, 18 Drawing Sheets

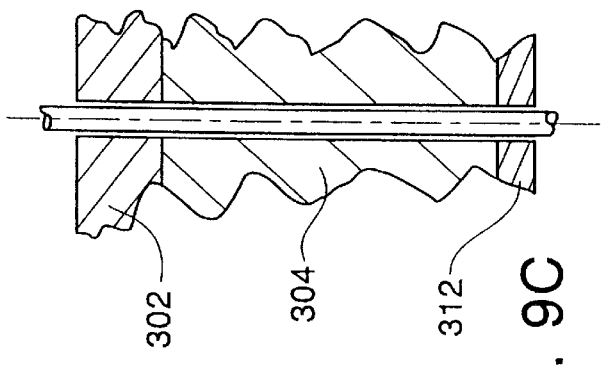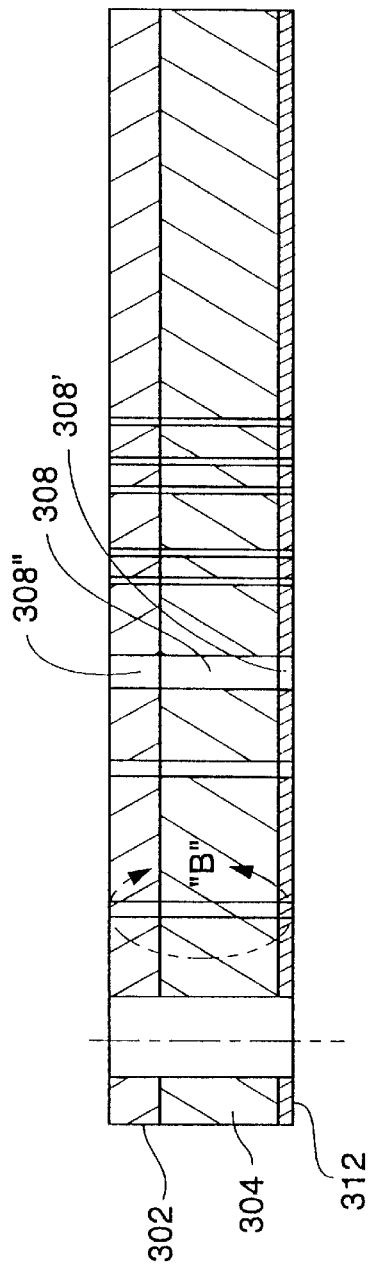

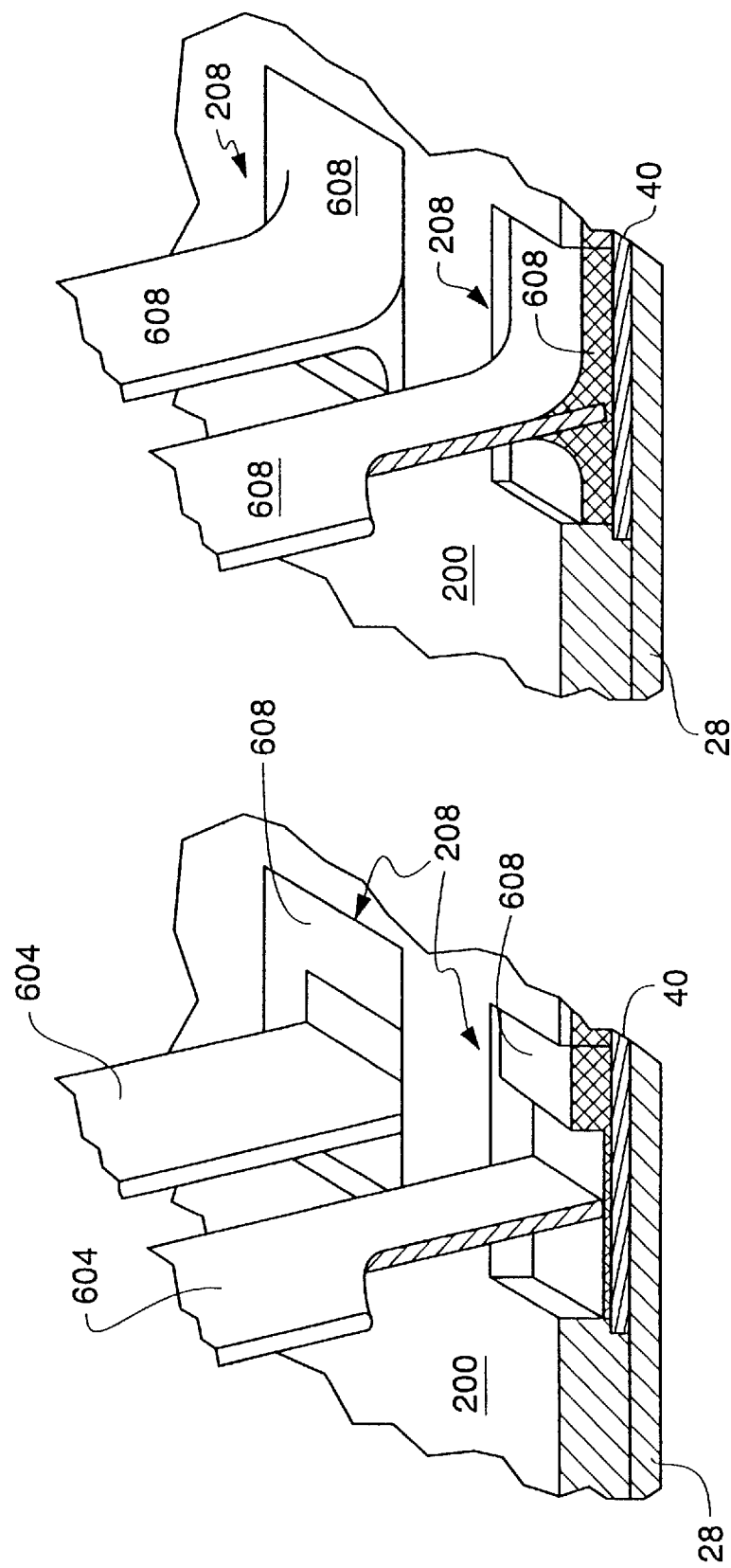

LATTICEWORK WITH PLURALITY OF OVERLYING LINES

FIELD OF THE INVENTION

The present invention relates to method and system for providing lattices in an overlying relationship and, in particular, to fabricating circuit boards by stamping circuit traces punched from a laminated circuit trace material onto a substrate wherein such circuit traces can be applied directly on top of one another without electrical interference.

BACKGROUND OF THE INVENTION

Circuit board fabrication has become an increasingly complex and expensive process as circuit boards become more densely packed with electrically communicating components. Various chemical layering techniques have been developed for isolating electrically conducting lines or traces on circuit boards. For lines or traces that could electrically interfere with one another by, for example, undesirably intersecting, these traces are separated or dispersed onto different layers and are insulated from each other. Thus, there may be a substantial number of layers of traces that make up the entire printed circuit board, depending on the geometry of the traces and the placement of components on the printed circuit board. A significant number of conducting traces are also electrically connected to pads to which electrical components are connected, such as integrated circuit chips.

Additionally, since such traces must also ultimately connect with either the electrical components provided on the circuit board pads or other traces on other layers, a large number of holes, i.e., via holes and blind holes (as they are known in the art), are typically provided as part of the circuit board for electrically communicating between the layers of the circuit traces. In fact, there may be as many as 30,000 to 40,000 such holes provided on a single circuit board.

Circuit board fabrication using such a trace layering strategy suffers from a number of drawbacks, including:

(1.1) The chemical interactions and steps required during circuit board fabrication may be relatively large, i.e., 30 to 120 different steps;

(1.2) The large number of holes increases the circuit board fabrication cost;

(1.3) A circuit board that is found to be defective is typically not repairable since circuit traces are embedded with the circuit board substrate;

(1.4) Many of the chemicals used in circuit board fabrication require special handling for disposal;

(1.5) The fabricated circuit boards have relatively low tolerances to heat; i.e., they may be unreliable above 135° F.;

(1.6) It is not easy to provide other than planar circuit boards, for example, fabricating circuit boards in the form of cylinders is difficult;

(1.7) It is not possible to provide circuit boards with a substrate such as, for example, aluminum; and (1.8) The length of individual traces may be longer than desired thereby slowing the processing efficiency of the circuit board.

Thus, it would be advantageous to provide a circuit board fabrication process that alleviated or at least mitigated the above drawbacks.

SUMMARY OF THE INVENTION

The present invention is directed to method and system for fabricating a circuit board of novel construction that addresses the drawbacks discussed above. In particular, the fabrication process of the present invention is substantially mechanical wherein circuit board conducting traces or lines are provided on a surface of a circuit board substrate substantially without regard to circuit traces crossing or intersecting one another. That is, circuit traces may cross or intersect one another in a substantially arbitrary manner without electrical signal migration between the crossing circuit traces.

Accordingly, the conducting traces and associated pads for each circuit board fabricated by the present invention are attached to the circuit board by successively stamping subcollections of circuit traces and pads (hereinafter, each subcollection also denoted a "lattice") from a circuit trace material onto the circuit board substrate area (and any underlying circuit traces previously stamped, depending on the circuit board design or layout). Inasmuch as the circuit trace material is a laminate having at least a conductor, an insulator (preferably underneath the conductor) and, at the bottom, a pressure-sensitive adhesive film, the stamping process causes the adhesive film to attach each circuit trace to the substrate and/or underlying circuit trace. Further, since each circuit trace has an insulator, each lattice of circuit traces may be electrically isolated from all other lattices of circuit traces provided on the circuit board.

The stamping process utilizes one or more circuit trace-shaped punch elements that slide within and between identical circuit trace-shaped cut-outs of at least two plates, i.e., a pressure plate and a die plate. Accordingly, when the circuit trace material is tightly sandwiched between the two plates, the punch elements are urged from a first position wherein they are seated in the cut-outs of only the pressure plate, to a second position where they are seated in the cut-outs of both plates. Thus, when the punch elements move between the plates, the circuit trace material is cut or punched to form circuit traces and/or pads in the shape of the punch elements (correspondingly, the cut-outs also). Subsequently, the newly punched circuit traces and/or pads are urged by the punch elements through the die plate and pressed against the circuit board substrate.

Following the successive stamping of the lattices having circuit traces and/or pads, the resulting latticework of overlying traces and pads is provided with a protective dielectric cover having openings aligned with the conductive pads wherein the openings provide exposure of the pads so that there may be electrical communication between the circuit traces and pads and other electrical components external to the covered circuit traces and pads. The protective cover is preferably composed of a deformable material so that when exposed to heat and pressure within a circuit board mold, the cover material flows or deforms in a direction substantially parallel to movement of the punch elements to both fix the alignment of the overlying traces and pads relative to one another and to permanently adhere them together.

Accordingly, it is an aspect of the present invention to be able to provide exceedingly dense circuit traces on the circuit board substrate by, for instance, stacking the circuit traces on top of one another.

It is a further aspect of the present invention to be able to correct defects in circuit boards during fabrication in a relatively straightforward manner. In particular, by testing the conductivity of the circuit traces prior to encapsulation with the dielectric cover, defective circuit traces may be reapplied to the substrate.

It is a further aspect of the present invention that circuit boards fabricated herein need have no holes for connecting circuit traces embedded at different layers within the substrate in that no such layers exist. Accordingly, significant cost advantages are provided by the present invention over conventional layering circuit board fabrication techniques.

It is yet a further aspect of the present invention that the stages or steps of fabrication of the circuit boards herein are substantially fewer than in prior art techniques. In particular, standard prior art techniques may require between 30 and 120 steps during circuit board fabrication. However, the present invention may fabricate circuit boards in 4 to 12 steps.

Further, it is an aspect of the present invention that the circuit board fabrication process may be quickly and straightforwardly reconfigured for fabricating circuit boards of different designs. In particular, the pressure plate, die plate and punch elements discussed above are removable and replaceable within a circuit board fabrication press which controls the movement of the punch elements in stamping circuit traces onto the circuit board substrate.

Since the circuit trace material insulates each lattice not only from other lattices but from the substrate as well, it is an aspect of the present invention that the circuit board substrate may be selected from a much wider range of materials than heretofore has been possible.

Lastly, it is an aspect of the present invention that due to the circuit board fabrication materials that may be used in fabricating circuit boards according to the present invention, circuit boards may be fabricated which can operate at up to 400° F.

Other features and benefits of the present invention will become apparent from the detailed description and the accompanying figures contained hereinafter.

BRIEF DESCRIPTION OF THE DRAWINGS

FIGS. 9A–9C illustrate stacking of certain elements of the lattice creation set in connection with simultaneous forming of cut-outs in or through these elements;

FIGS. 18A–18B illustrate a method for connecting electrical component leads to a circuit board fabricated by the present invention.

DETAILED DESCRIPTION

Figure 1:
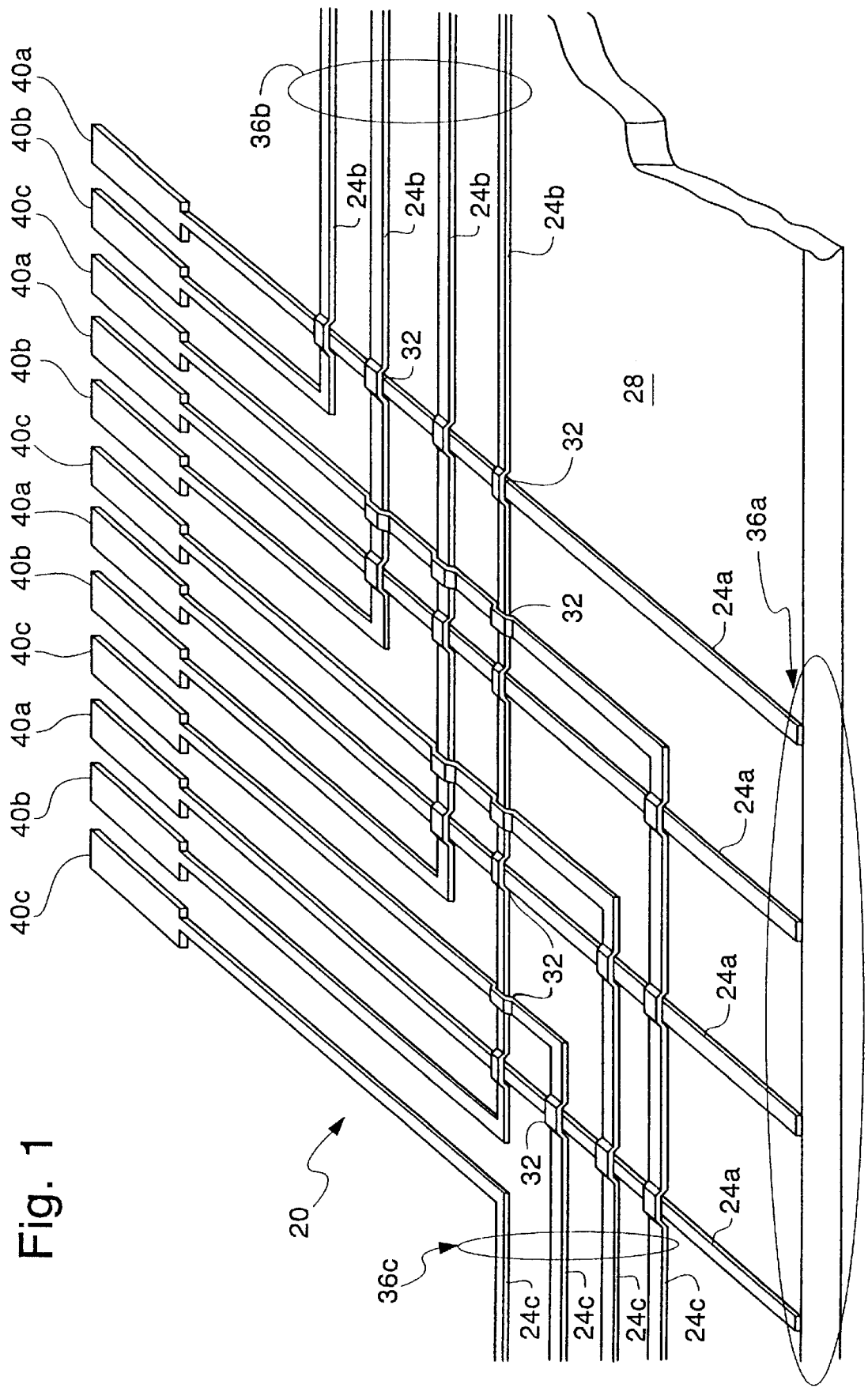
FIG. 1 illustrates a portion of a circuit board fabricated by the present invention wherein three circuit trace configurations or lattices have been successively stamped onto the surface of a circuit board substrate, providing numerous circuit traces intersection regions where the circuit traces overlap one another.

In FIG. 1, a latticework 20 of circuit lines or traces 24 is illustrated on a surface of a circuit board substrate 28. Note that the circuit traces 24 overlap one another at various intersection regions 32 without electrical interference. Briefly, in providing this overlapping capability without electrical interference, the circuit trace material from which each trace 24 is provided includes at least a conductor for carrying electrical signals, an insulator and an adhesive film for attaching the trace to the surface of the substrate 28. Accordingly, to provide the latticework 20 of FIG. 1, sets or lattices 36 having circuit traces 24 were iteratively applied to the surface of the substrate 28. That is, a first lattice 36a including the conducting traces 36a was first applied to the surface of the substrate 28. Subsequently, a second lattice 36b including the circuit traces 24b was applied to the surface of the substrate 28. Lastly, a third lattice 36c, including the circuit traces 24c was applied to the surface of the substrate 28, and all previously applied traces. Each circuit trace 24 is able to provide electrical communication with electrically connected end points which typically are pads 40. Such pads are, in most cases: (a) integral with connected traces 24; and (b) applied to the surface of the substrate 28 simultaneously with each circuit trace 24 to which the pad is connected. It should be understood, however, that portions of one or more pads 40 may overlie a trace 24 so that not all portions of all pads 40 contact the substrate 28. The pads 40 commonly, but not necessarily, terminate both ends of each circuit trace 24 and these pads 40, as well as their corresponding circuit traces 24, may be arranged on the surface of the substrate 28 in a substantially larger number of geometric configurations than heretofore has been possible. For expediency and/or performance, instead of the circuit traces 24 intersecting at 90° to one another, such circuit traces 24 may be angled at substantially any angle to one another. Accordingly, circuit board designs may be provided in which circuit traces or lines 24 are a straight line, point-to-point connections so that the total linear length of the traces 24 is substantially reduced, thereby enhancing the performance of the circuit board in which the circuit traces are incorporated. Accordingly, the intersection regions 32 may have circuit traces that intersect at any angle and in fact, since circuit traces 24 may in some circumstances be substantially co-linear, the intersection regions 32 may cover a non-trivial length of two or more circuit traces 24. Further, it should be noted that intersection regions 32 are not limited to the intersection of only two circuit traces 24. Rather, traces 24 may be stacked upon one another repeatedly. For example, by iteratively applying lattices 36 to a surface of the substrate 28 wherein three or more circuit traces 24 from different lattices 36 intersect, an intersection region 32 is provided having three circuit traces 24 stacked on top of one another. Thus, the present invention allows for the design of circuit boards wherein each circuit trace 24 traverses the surface of the circuit board substrate 28 between the trace's terminating pads 40 with few if any curves or bends in the circuit trace. In this case, such a latticework 20 may appear to be more like an abstract "weaving" or "tangle" of circuit traces 24. However, regardless of the ultimate pattern provided on the surface of the substrate 28, for notational convenience, this pattern shall be referred to as a "latticework" and each integral set of circuit traces 24 and pads 40 provided on the surface of the substrate 28 will be referred to as a lattice 36.

Figure 2A:
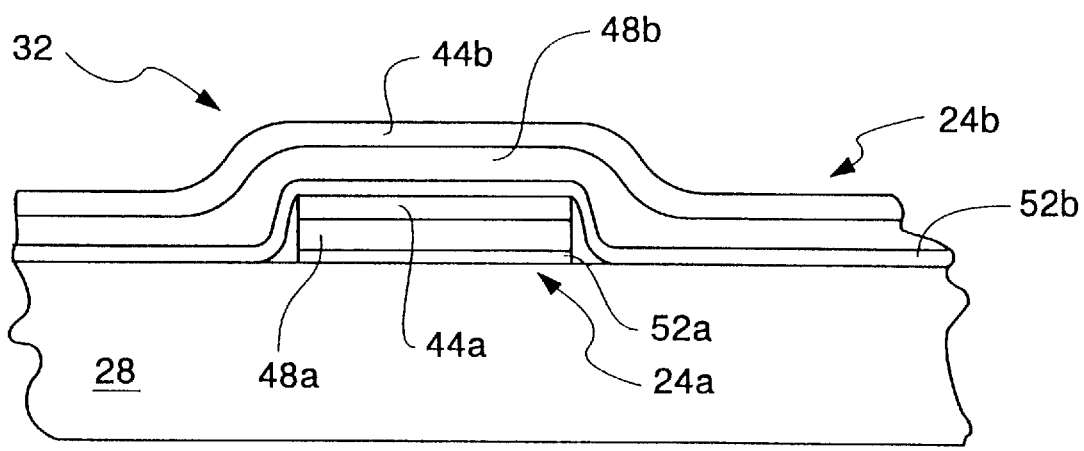
FIG. 2A illustrates a cross-section of an overlap of two circuit traces that, for example, occurs in intersection regions of FIG. 1.

To better provide an understanding as to how the circuit traces 24 may overlap one another in intersection regions 32 without electrical interference such as crosstalk between individual traces 24, reference is made to FIG. 2A. As seen, a cross-section of an intersection region 32 of FIG. 1 is illustrated in which only two circuit traces 24 overlap one another. Referring first to the cross-section of the circuit trace 24a, the topmost layer of trace 24a is an electrical conductor 44a, such as copper. Below this conductor 44a and laminated to it is an insulator 48a which serves as a dielectric in the present embodiment. Lastly, on the lower side of the insulator 48a is a thin coating of adhesive 52a for adhesively binding the circuit trace 24a to the surface of the substrate 28 as well as to other circuit traces 24 (if such other traces are provided on substrate 28 before trace 24a). Referring now to circuit trace 24b of FIG. 2A, it is seen that an identical cross-section is provided for this circuit trace. However, regardless of whether the circuit traces 24a and 24b have identical cross-sections or not, it is an important aspect of the present invention that the insulator 48 be of sufficient dielectric to substantially entirely prohibit electrical signal migration between any combination of conductors 44 and the substrate 28.

Note that it is well within the skill of the adhesive backed material art to fabricate sheets of material from which the circuit traces 24 and any associated pads 40 may be fabricated. For example, in the present embodiment illustrated in FIG. 2A, the insulators 48 may include a thermoplastic and the adhesive film 52 includes any adhesive that has the necessary adhesive properties, as well as maintaining such properties during the fabrication process, such as when heat and pressure are applied.

Figure 2B:
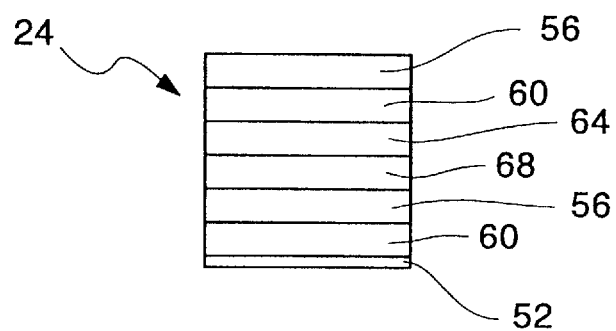
FIG. 2B illustrates a cross-section of an alternative embodiment of a circuit trace having a number of layers different from FIG. 2A.

It is also within the scope of the present invention to provide circuit traces 24 from a wide variety of materials. For example, in FIG. 2B, a cross-section of an alternative embodiment of a circuit trace 24 is illustrated. The uppermost section 56 of this cross-section is a magnetic media. Below this section 56 is a plastic insulator 60 serving as a dielectric. Below the insulator 60 is a copper conductor. Below the conductor 64 is another plastic dielectric or insulator 68. Below the dielectric 68 is another section 66 of magnetic media. Below this is another insulating plastic 70 wherein an adhesive thin film 52 is provided. As in FIG. 2A, the thin film adhesive 52 should be capable of binding to the surface of the substrate 28 to which the circuit trace 24 is to be applied as well as able to bind to the uppermost surface of other traces such as the top magnetic media 56.

Figure 3:
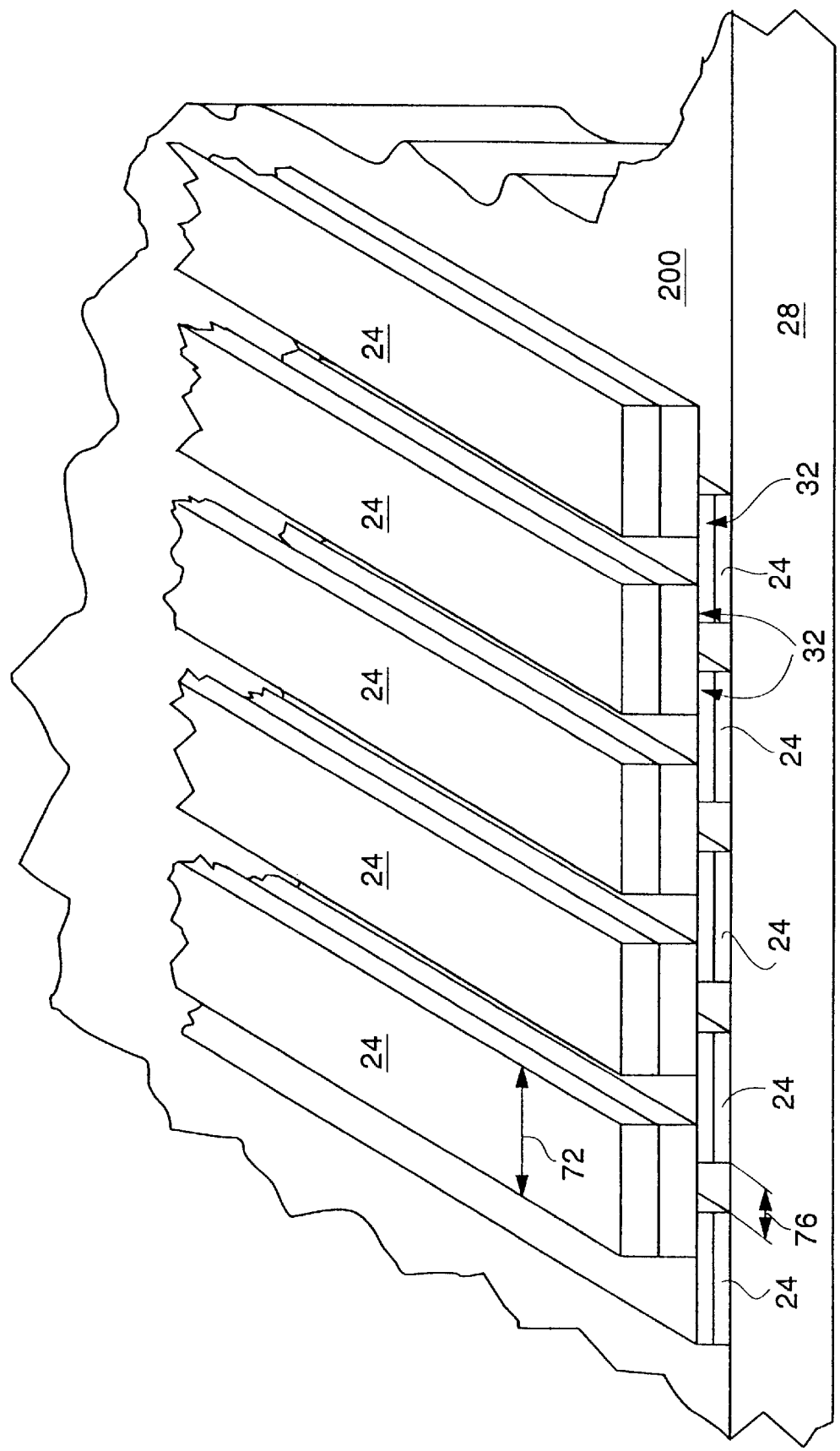
FIG. 3 illustrates lattices of circuit traces.

In FIG. 3, an alternative embodiment of the latticework 20 is illustrated wherein, as mentioned above, the intersection regions 32 can be substantially collinear with the circuit traces 24. In FIG. 3, the circuit traces 24 are stacked on one another in an offset fashion. Note that this stacking or overlying lattice arrangement may be used to provide ultradense circuit traces on a circuit board. In particular, the present invention allows the circuit traces 24 to be aligned as shown in this figure wherein the width 72 of the circuit traces 24 is approximately 8 mil and the spacing 76 between the adjacent circuit traces 24 is approximately 2 mil. Therefore, approximately 200 distinct circuit traces 24 may be provided in this manner within a width (along the direction of arrow 72) of approximately one inch.

Figure 4:
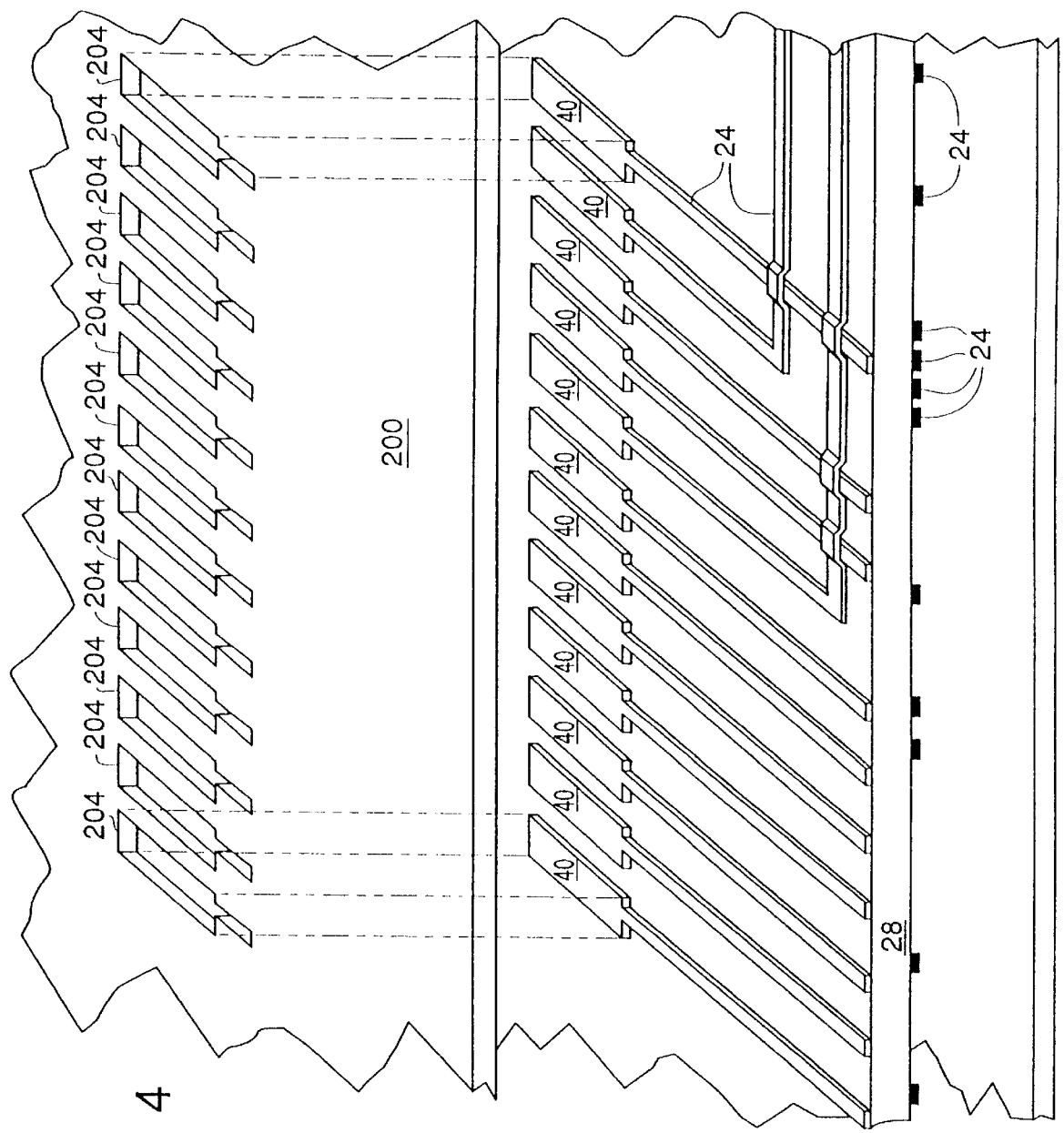
FIG. 4 illustrates a step in the circuit board fabrication method and system of the present invention wherein a cover is aligned on top of the circuit board substrate and lattices so that the circuit traces are protectively covered and so that the circuit pads are exposed through the openings provided within the circuit board cover.

Following the providing of the circuit traces 24 and their connected pads 40 on the surface of a substrate 28, a subsequent step in the fabrication of circuit boards is illustrated in FIG. 4. That is, for each circuit board being fabricated by the present invention, a cover 200 is provided for sandwiching the circuit traces 24 on a surface of the substrate 28 between the substrate 28 and the cover 200. Thus, the cover 200 provides an outer protection for the conductive traces 24 as well as fixing their paths on the surface of the substrate 28 (as will be described in detail hereinbelow). Note, however, that the cover 200 also includes openings 204 that breach the cover 200 so that when the cover 200 is aligned appropriately with the substrate 28, the openings 204 align with pads 40 so that electrical communication can be provided between the circuit traces 24 and electrical components having connections to the circuit traces via access to the pads 40 by way of the openings 204. Accordingly, as will also be illustrated hereinbelow, each openings 204 forms a sealed recess or well about its corresponding pad 40 to which it provides access. That is, once the cover 200 is appropriately aligned upon substrate 28, both pressure and heat are applied, as will be discussed in further detail hereinbelow, so that the cover 200 becomes sufficiently flowable and adhesive-like so that it flows into crevices about the circuit traces 24 and adheres to the traces 24 and pads 40 of each lattice thereby encapsulating and fixing the latticework 20 in place. In one embodiment, the substrate 28 and the cover 200 are made of the same or similar material and react the same way when pressure and heat are applied.

Figure 5:
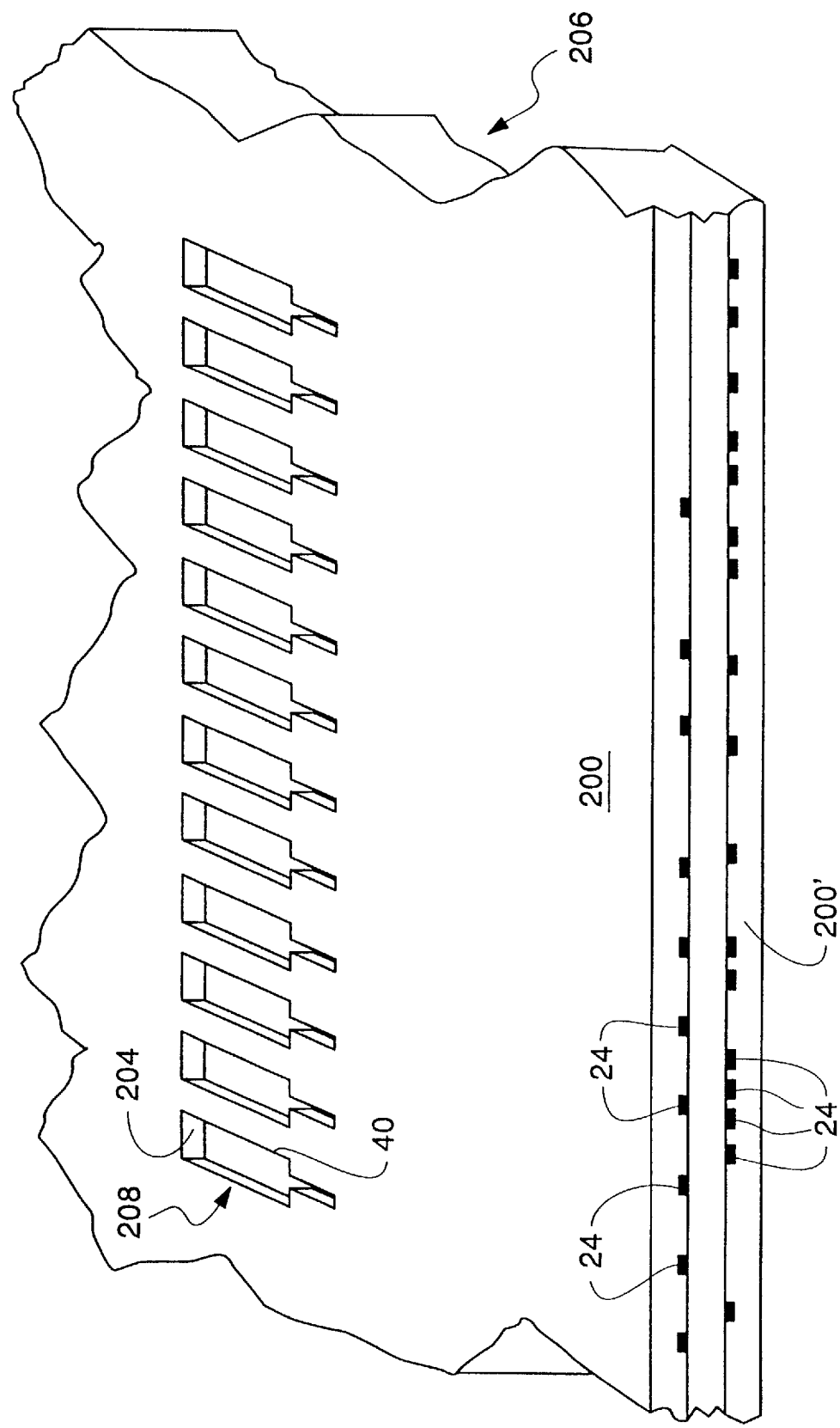
FIG. 5 illustrates a portion of a circuit board fabricated by the present invention.

In FIG. 5, a portion of a circuit board 206 fabricated according to the present invention is illustrated wherein this portion shows the cover 200 laminated onto the substrate 28 and thereby embedding the circuit traces 24 into the cover 200. Accordingly, as mentioned in the description for FIG. 4, the openings 204 provide access to the pads 40 such that a sealed recess or well 208 is formed from a corresponding opening 204 and pad 40. Further, note that the present figure also illustrates that an opposing cover 200' may be laminated to the opposite side of substrate 28 thereby encapsulating and fixing circuit traces 24' that are on the opposite side of the substrate 28, when heated under pressure.

Figure 6:
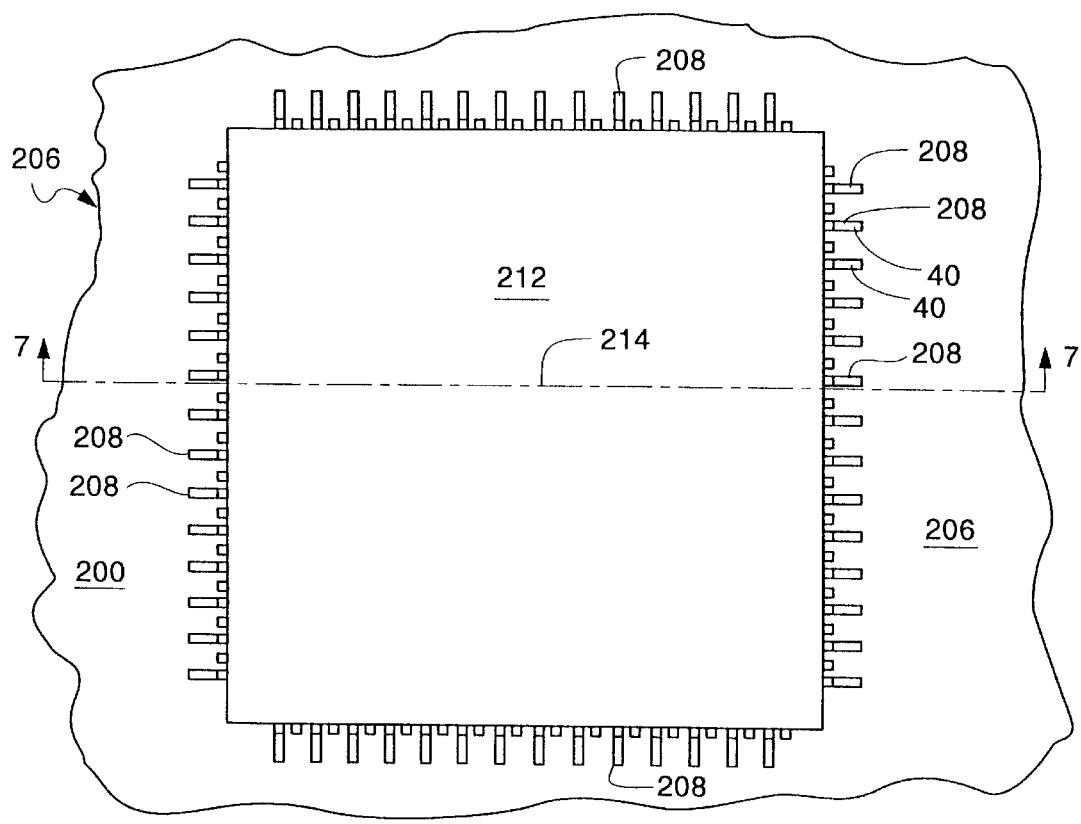
FIG. 6 illustrates the placement of an integrated circuit within a circuit board fabricated by the present invention wherein leads from the integrated circuit are soldered to the pads in the bottom of the wells.
Figure 7:
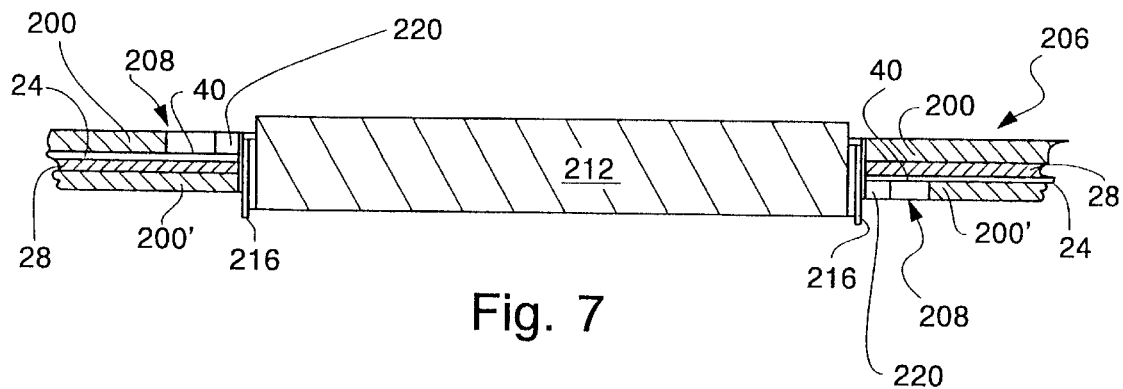
FIG. 7 is a cross-sectional view, taken along line 7—7 of FIG. 6, that illustrates the circuit board and embedded integrated circuit.

Referring now to FIGS. 6 and 7, a plan view and a corresponding cross-sectional view, respectively, of another portion of a circuit board 206 are illustrated, wherein an integrated circuit chip 212 is package mounted through the circuit board 206 so that circuit traces 24 on both sides of the substrate 28 may be electrically connected to the chip 212. In particular, FIG. 7 illustrates a cross-section taken along the axis 214 of FIG. 6. Accordingly, as particularly shown in FIG. 7, the leads 216 from the chip 212 enter into the wells 208 on either side of the circuit board 206 via an open end into each of the wells 208. Further, note that disposed in each of the wells 208 is a solder core 220 that may be subsequently heated for fixing the leads 216 within the wells 208 and thereby establishing an electrical conduit between the leads 216 and their corresponding pads 40 at the base of the well 208 to which each lead 216 enters.

Figure 8:
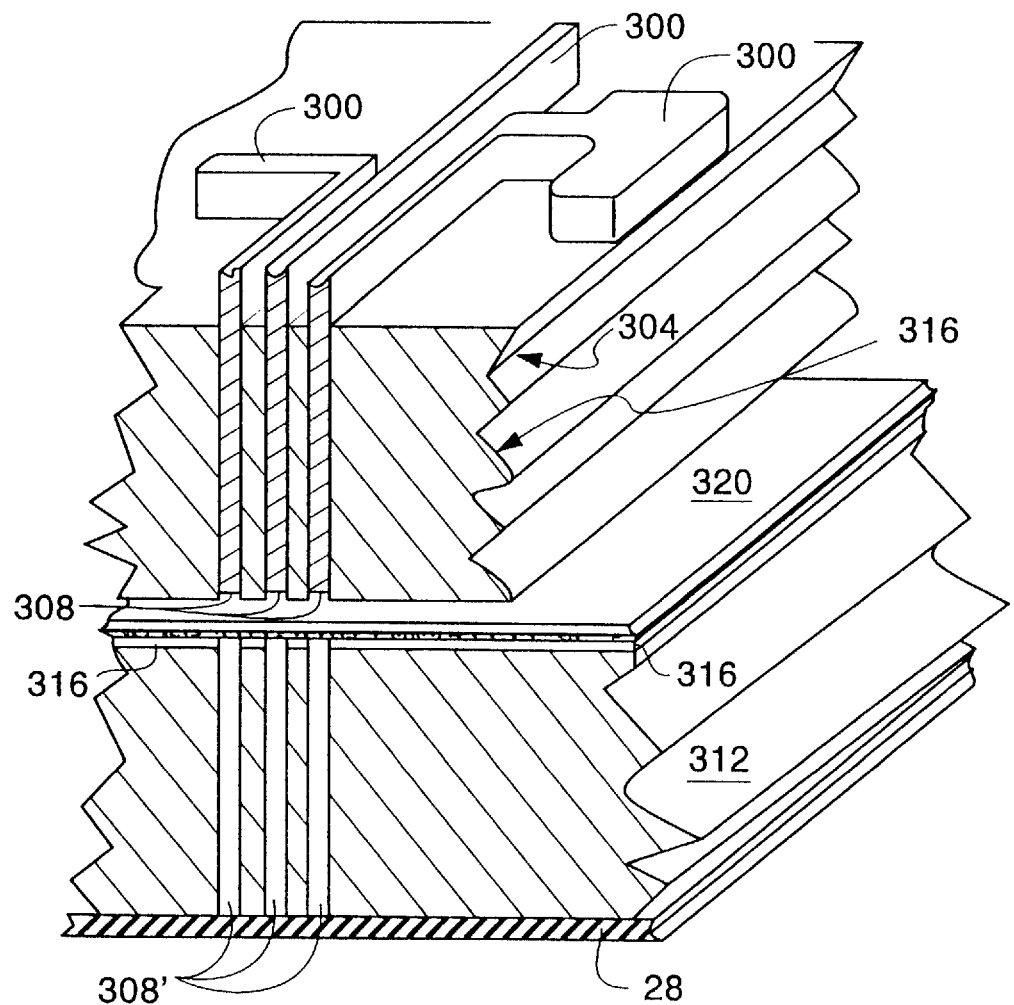
FIG. 8 illustrates one embodiment of the apparatus of the present invention for stamping a lattice of circuit traces onto a circuit board substrate.

FIG. 8 illustrates a cross-section of an apparatus for providing a lattice 36 of circuit traces 24 and pads 40 on a substrate 28. In particular, the apparatus includes a plurality of punch elements 300 (three of which are represented in the present figure), a punch holder 302 to which the punch elements 300 are fixably held, a pressure plate 304 and a die plate 312 (these four components denoted as a "lattice creation set"). Note that the punch elements 300 are disposed within cut-outs 308 of a pressure plate 304, wherein the punch elements 300 are slidable within their respective cut-outs 308. The tolerance between the punch elements 300 and their corresponding cut-outs 308 is extremely tight. Both the punch elements 300 and their respective cut-outs 308 provide an outline of a lattice 36 that is to be affixed to the substrate 28. Below the pressure plate 304 is a die plate 312 that includes matching cut-outs 308'. The punch elements 300, together with the punch holder 302, are moved under control of a punch actuator (not shown). The punch elements 300 slide through the cut-outs 308 that each is aligned with and into the cut-outs 308' during operation as will be described hereinbelow.

Figure 9A:
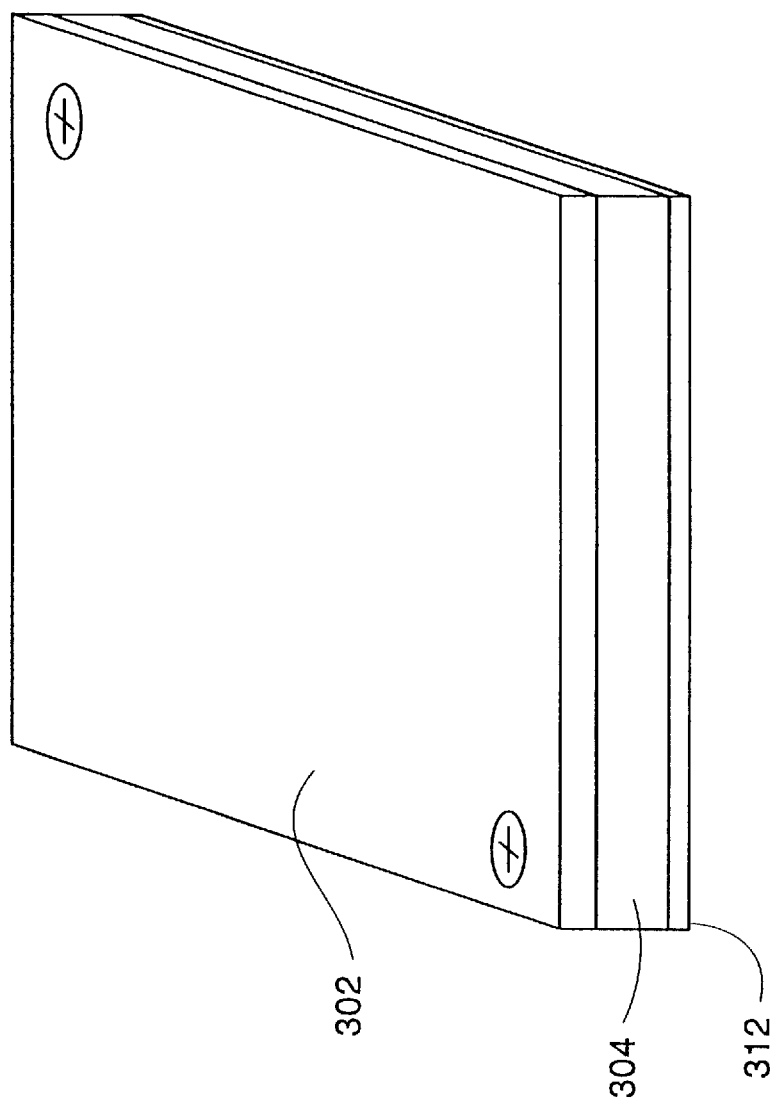
Figure 9D:
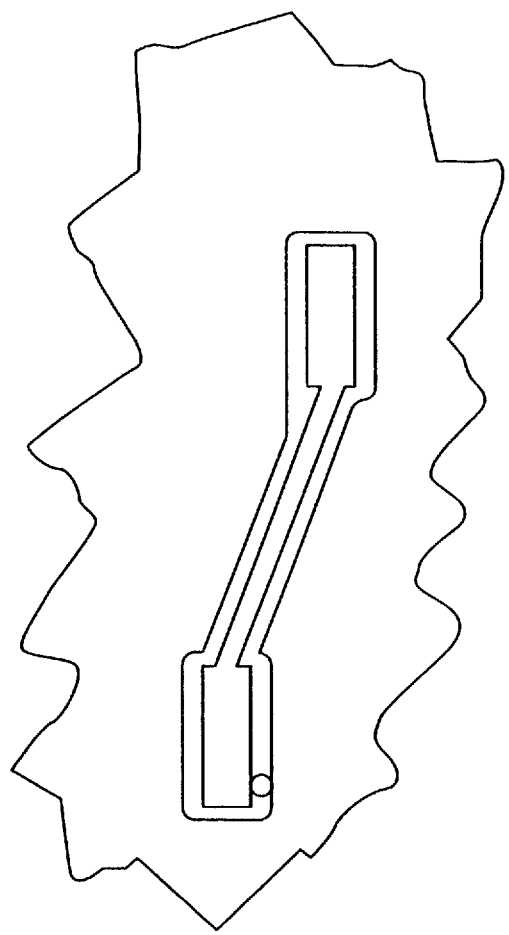
FIG. 9D illustrates making a punch element of the lattice creation set.

With reference to FIGS. 9A–9C, making the punch holder 302, the pressure plate 304 and the die plate 312 with cutouts is described. In that regard, cut-outs, 308" are also created in the punch holder 302. The punch elements 300 are fixedly disposed in the cut-outs 308" of the punch holder 302 by, for example, adhesive bonding. Preferably, the materials or plates from which the punch holder 302 with resulting cut-outs 308", the pressure plate 304 with resulting cut-outs 308 and the die plate 312 with resulting cut-outs 308' are stacked in desired alignment to achieve the exact matching of the cut-outs 308", 308, 308'. Preferably, the cut-outs 308", 308, 308', are produced at the same time using electric discharge machinery (EDM) technology in which electrostatic discharge from a wire of the EDM hardware is applied to the stacked plates 302, 304, 312 to erode material in a predetermined manner in conjunction with simultaneously forming the cut-outs 308", 308, 308'. Accordingly, the necessary exact matching among cut-outs 308", 308, 308' is accomplished. Due to the simultaneously making of these cut-outs 308", 308, 308', if there should be a slight variation from the desired path or outline of the cut-outs, this variation is carried through and is present in all of the cut-outs of the stacked plates. As illustrated in FIG. 9B, the EDM wire is utilized to simultaneously form the cut-outs 308", 308 and 308' in the respective elements 302, 304, 312. With respect to making of the punch elements 300, they are formed separately from the making of the cut-outs for the punch holder 302, pressure plate 304 and the die plate 312. With reference to FIG. 9D, a punch element 300 is made separately to match or mate with cut-outs that the particular punch element 300 is to be used with by means of the EDM wire cutting the punch element 300 from a hardened steel plate. Additionally, it is important to note that the upper surface of the die plate 312 is made to include a baked-on permanent mold release coating 316 such as "TEFLON".

Figure 10:
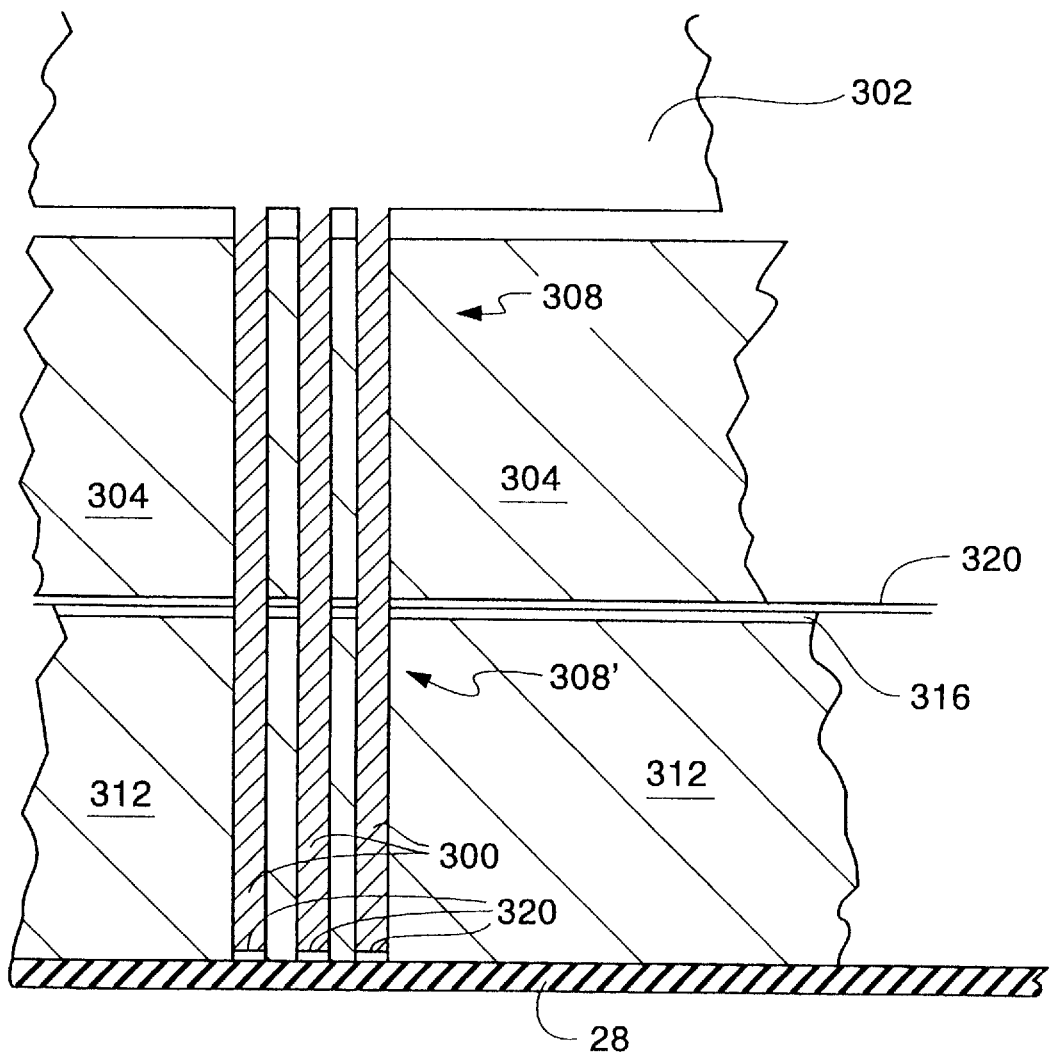
FIG. 10 illustrates the punch elements stamping a lattice of circuit traces onto the substrate.

In operation, once the pressure plate 304, its mating punch elements 300 joined to the punch holder 302, and the matching die plate 312 of a lattice creation set are aligned within a press (not shown), a sheet of circuit trace material 320 (e.g., a copper foil laminated to a layer of thermoplastic having a pressure sensitive adhesive coating on its bottommost surface) is positioned between the pressure plate 304 and the die plate 312 so that it is parallel to the planes of the adjacent surfaces of the pressure and die plates 304, 312. Subsequently, the pressure and die plates 304, 312 are brought together thereby fixing the circuit trace material 320 so that it remains precisely positioned. Accordingly, once the circuit trace material 320 and the substrate 28 are provided in their respective positions, the press (not shown) is actuated so that the punch elements 300 project through the bottom cut-outs 308 of the pressure plate 304 and through the circuit trace material 320 and subsequently into the cut-outs 308'. Since the cut-outs 308' are identical to the cut-outs 308, the close tolerance between the cut-outs 308, 308' and the punch elements 300 induces a cutting of the circuit trace material 320 into a pattern conforming to the shape of the punch elements 300. Accordingly, when the bottommost surface of the punch elements 300 enters the cut-outs 308', a corresponding punch element shaped pattern of circuit trace material is moved vertically down through the cut-outs 308' and ultimately is deposited as a lattice 36 on the substrate 28 as illustrated in FIG. 10. Subsequently, the punch press causes punch elements 300 to recede from the cut-outs 308', leaving the punch element pattern of the circuit trace material on the uppermost surface of the substrate 28. Accordingly, once the bottom surface of each of the punch elements 300 has receded into the pressure plate 304, the pressure and die plates 304, 312 move away from one another thereby releasing the circuit trace material 320 so that it may be moved. Additionally, the substrate 28 may be moved so that, for example, the next copy of the pattern corresponding to the punch elements 300 may be provided onto either another substrate 28 area for the same circuit board or an area for a different circuit board.

Note that there are at least two methods for stamping lattices 36 onto the circuit boards 206. In a first method, a single press may be used wherein a first lattice creation set is provided within the press (not shown) and the press subsequently operates to stamp an identical first lattice 36 on each of a plurality of substrate areas, each area corresponding to a circuit board 206 to be formed. That is, each circuit board substrate area is shifted beneath the die plate 312 of the creation set and the first lattice is stamped onto the circuit board substrate area. Subsequently, once the required number of circuit boards have had the first lattice 36 corresponding to this first lattice creation set applied to them, an operator removes the first lattice creation set and replaces it with a second lattice creation set so that a different lattice 36 may be stamped onto the circuit board substrate areas. Thus, with the substrate 28 again aligned underneath the new pair of plates of the second creation set, each of the circuit board substrate areas being fabricated on the substrate 28 can now have this different lattice stamped onto the surface of the substrate 28 (and any underlying previously applied circuit traces 24 of the first lattice 36).

With respect to the providing of overlying or stacked lattices 36, it is essential that sufficient pressure, and no more, be applied when providing an overlying trace 24 on top of an underlying trace. Such sufficient pressure causes the adhesive film of the overlying trace 24 to properly adhere to the underlying trace 24 so that the underlying trace is not broken, damaged or otherwise detrimentally impacted by the contact with the overlying trace 24. Together with sufficient pressure being applied, the press or punching assembly also has one or more stops that are associated with movement of the punch elements 300. In that regard, the stops limit movement of the punch elements 300 so that an overlying trace 24 cannot be caused to move a distance that would detrimentally impact an underlying trace 24 or the substrate 28. That is, the one or more stops are operatively associated with the punch elements 300 to prevent unwanted, too great movement in moving the overlying circuit trace relative to the underlying circuit trace.

Figure 11A:
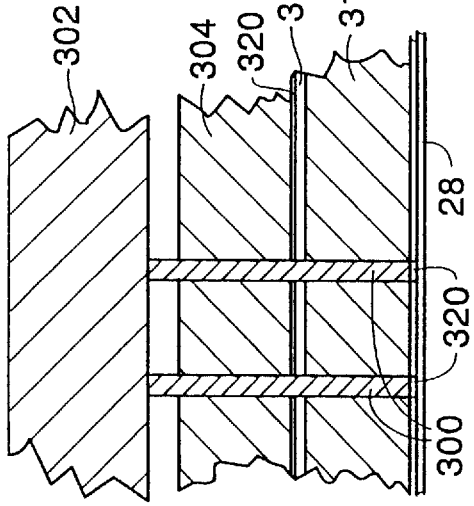
FIGS. 11A–11C illustrate a method for providing densely packed circuit traces onto a circuit board.
Figure 11B:
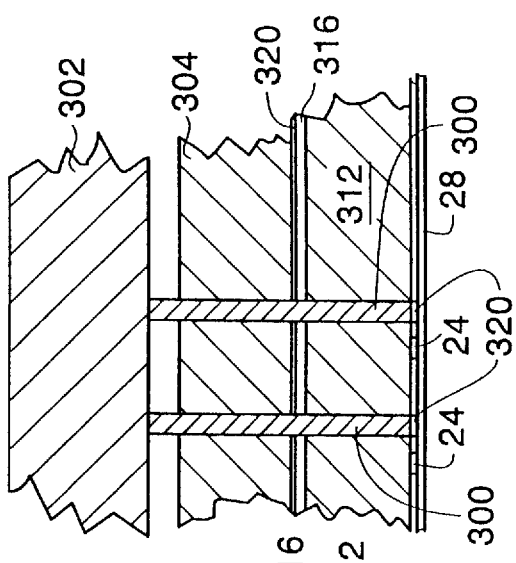
Figure 11C:
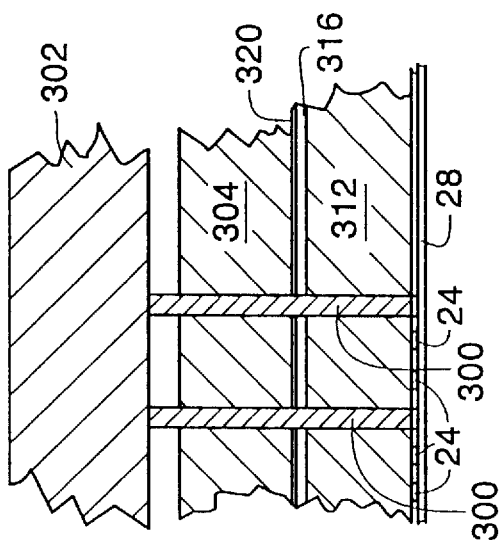

The above procedure of replacing each lattice creation set after the corresponding lattice 36 has been stamped onto each circuit board substrate area may be repeated until each such area includes all lattices 36 required. It is important to note that in many circuit board designs a lattice 36 may also be repeatedly applied to the same circuit board substrate area, wherein each application is offset from other applications. Accordingly, a single lattice creation set may be used repeatedly in fabricating a single circuit board 206 by shifting the substrate 28 appropriately. For example, referring to FIGS. 11A–11C, these figures illustrate a single lattice creation set used repeatedly on the same circuit board substrate area. That is, the lattice creation set provides a pressure and die plate pair 304, 312 and a pair of punch elements 300 for punching a pair of circuit traces 24 onto a substrate 28. In particular, in FIG. 11A, two circuit trace patterns 320 are shown being applied to the circuit board substrate area. In FIG. 11B, the substrate 28 has been shifted a relatively small amount within the same circuit board substrate area and the same punch elements 300 as were used in FIG. 11A are again utilized so that a second offset pair of circuit trace patterns 320 is applied to the circuit board substrate area. Following this application, in FIG. 11C, a further shifting of the substrate 28 has been performed for applying yet another circuit trace pattern 320 to the circuit board substrate area.

Figure 12:
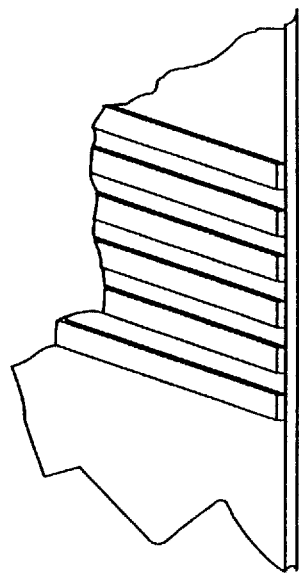
FIG. 12 illustrates the results of the process of FIGS. 11A–11C.

Thus, as one skilled in the art will appreciate, since the shifting of the substrate 28 can be controlled within very fine tolerances, the presently disclosed circuit board fabrication method and apparatus of the present invention can provide ultrafine, closely spaced circuit traces as shown in FIG. 12. Further, it is important to note that a single lattice creation set may also be used for providing circuit traces 24 in a stacked fashion as illustrated in FIG. 3. That is, once the circuit traces 24 directly attached to the surface of the substrate 28 have been applied as, for example, using the method illustrated in FIGS. 11A–11C, the substrate 28 may be shifted in an opposite direction for subsequent application of the second level of circuit traces 24 in the offset fashion illustrated in FIG. 3 using the same pressure and die plates.

In a second embodiment for fabricating printed circuit boards 206, instead of replacing a lattice creation set when providing successive lattices 36, a sequence of adjacently placed lattice creation sets are aligned, for example, within a single press wherein each lattice creation set is used for stamping its particular lattice 36 onto each circuit board substrate area. Accordingly, during this method and system for fabricating circuit boards 206, the substrate material 28 moves below a series of pressure and die plate pairs of each lattice creation set, wherein each successive lattice 36 of circuit traces is applied to the circuit board substrate areas as they successively move below each of the pressure and die plate pairs. As an aside, note that in this embodiment, the circuit trace material may move between the plates at an angle of 90° to the shift performed on the substrate 28.

Figure 13:
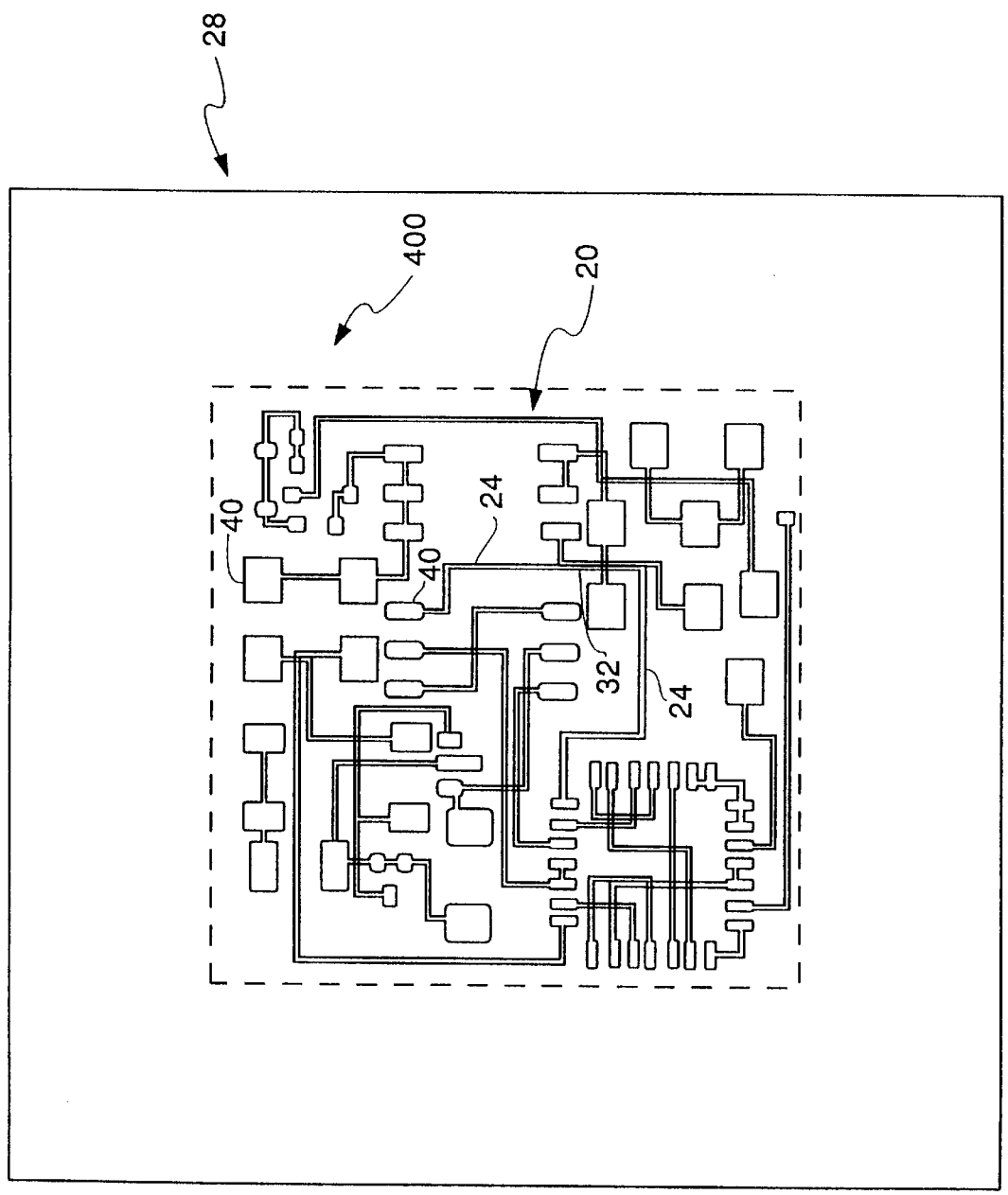
FIG. 13 illustrates one circuit board design that may be provided on the surface of a circuit board substrate by the present invention.

To further illustrate the circuit board fabrication process of the present invention, reference is made to FIGS. 13–16. In FIG. 13, a sheet from, for example, a portion of a roll of substrate 28 is illustrated wherein the circuit traces 24 and their associated pads 40 have been fabricated onto a circuit board substrate area for a circuit board 206. Note that even in this simple example of the circuitry for a circuit board 206, there are numerous intersection regions 32 which in prior art circuit board fabrication technology would require a chemical layering of the circuits and, potentially, various holes within the substrate 28 for electrically connecting various traces 24 and/or their associated pads 40.

Figure 14:
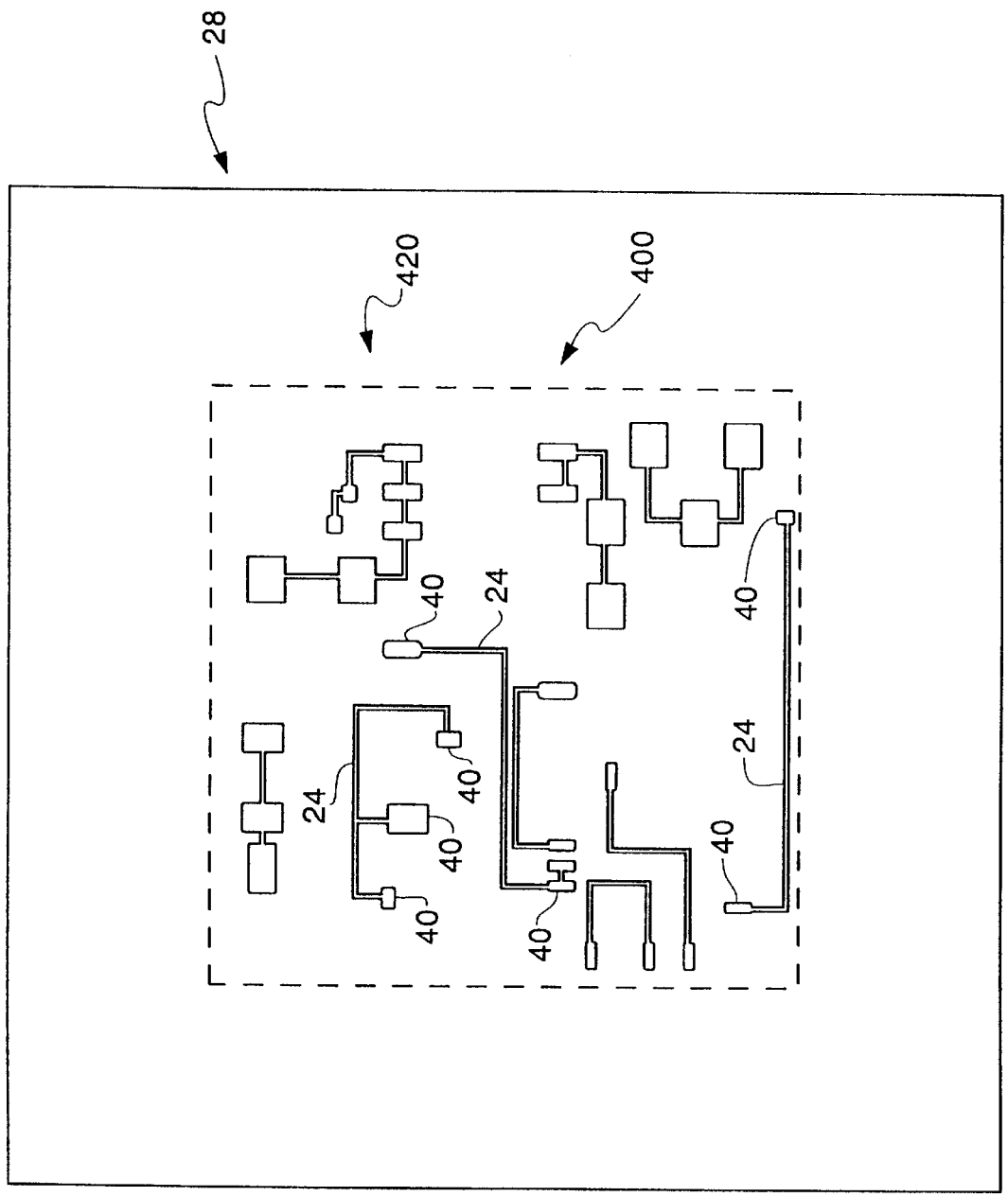
FIGS. 14–16 illustrate the decomposition of the latticework of FIG. 13 into circuit trace lattices that may be successively stamped onto the circuit board substrate.
Figure 15:
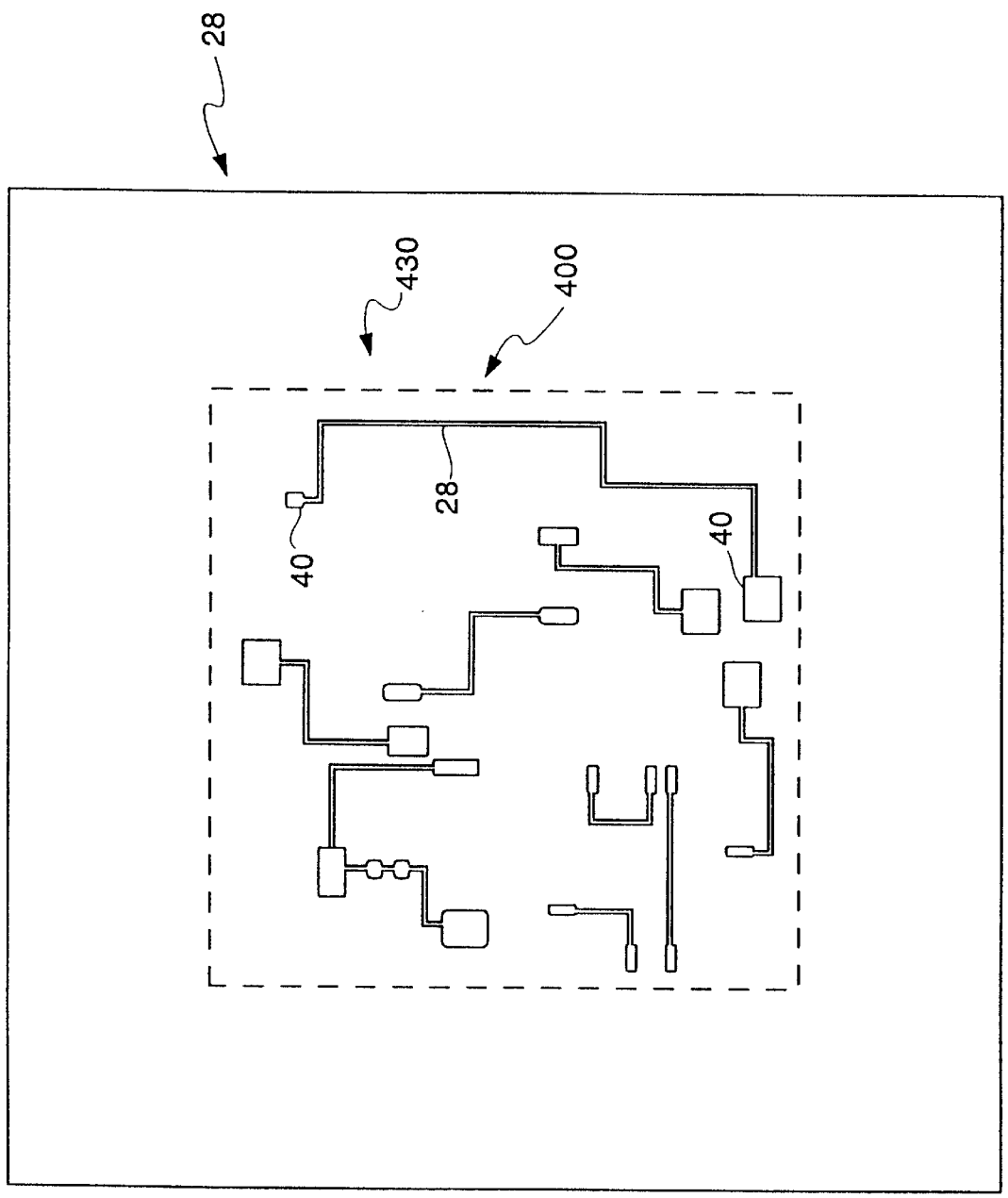
Figure 16:
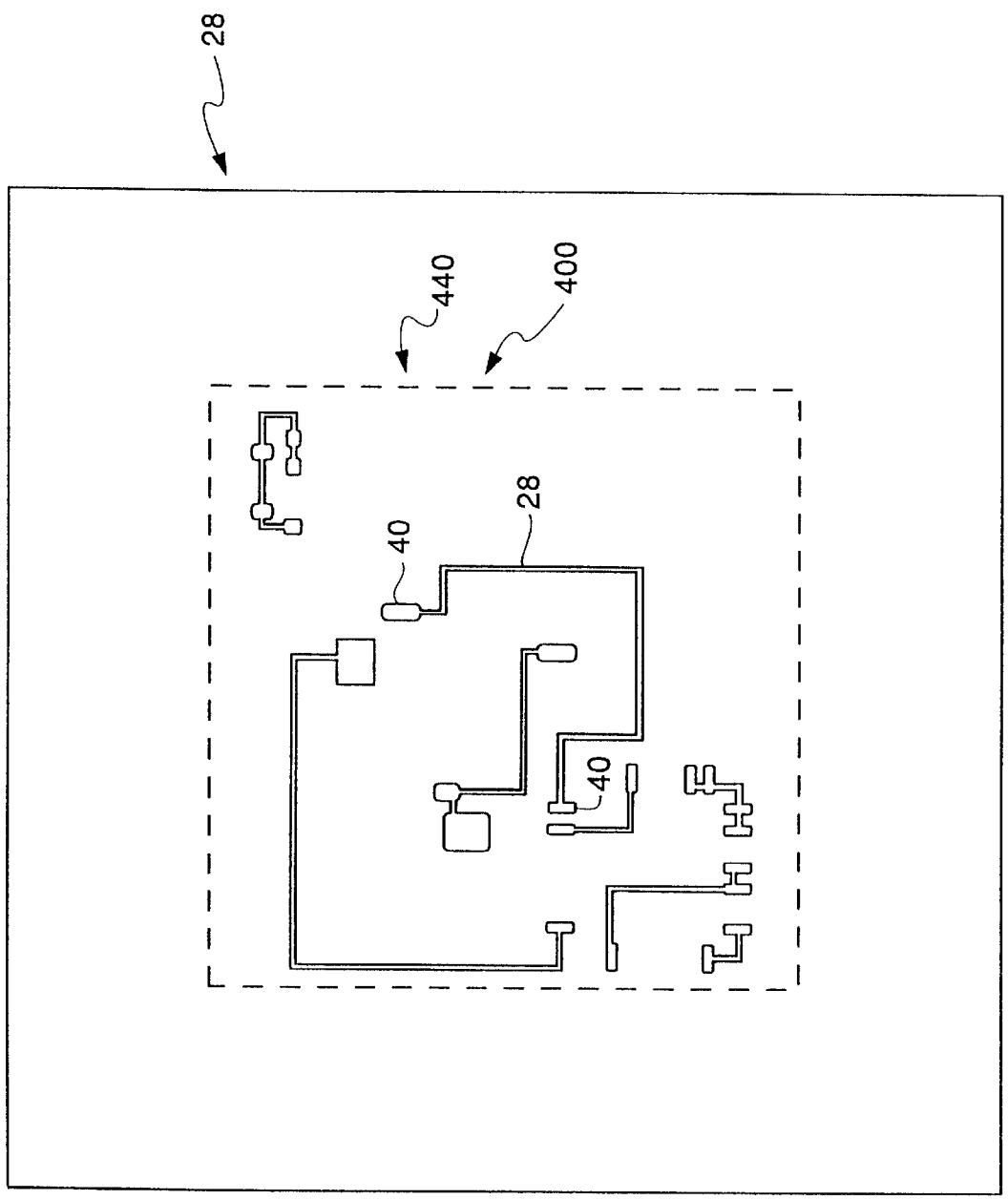

In each of the FIGS. 14–16, a single circuit board lattice 36 is illustrated wherein each of these lattices is a subset of the latticework 20 provided on circuit board substrate area 400 (FIG. 13). Further, for each FIGS. 14–16, the corresponding lattices 36 may be stamped onto the substrate 28 by the method and system of the present invention. That is, for each FIGS. 14–16, a corresponding lattice creation set of a pressure plate 304, die plate 312 pair and mating punch elements 300 held by punch holder 302 is provided for punching or stamping out each of the circuitry patterns for each of these figures successively onto the surface of the substrate 28. Thus, the circuitry 420 of FIG. 14 may be applied as the first lattice 36 to be stamped onto the circuit board substrate area 400. Subsequently, the lattice 430 of FIG. 15 may be stamped onto the same substrate area 400 and finally, the lattice 440 of FIG. 16 may also be stamped onto the substrate area 400 to complete the latticework 20 of FIG. 13.

Figure 17:
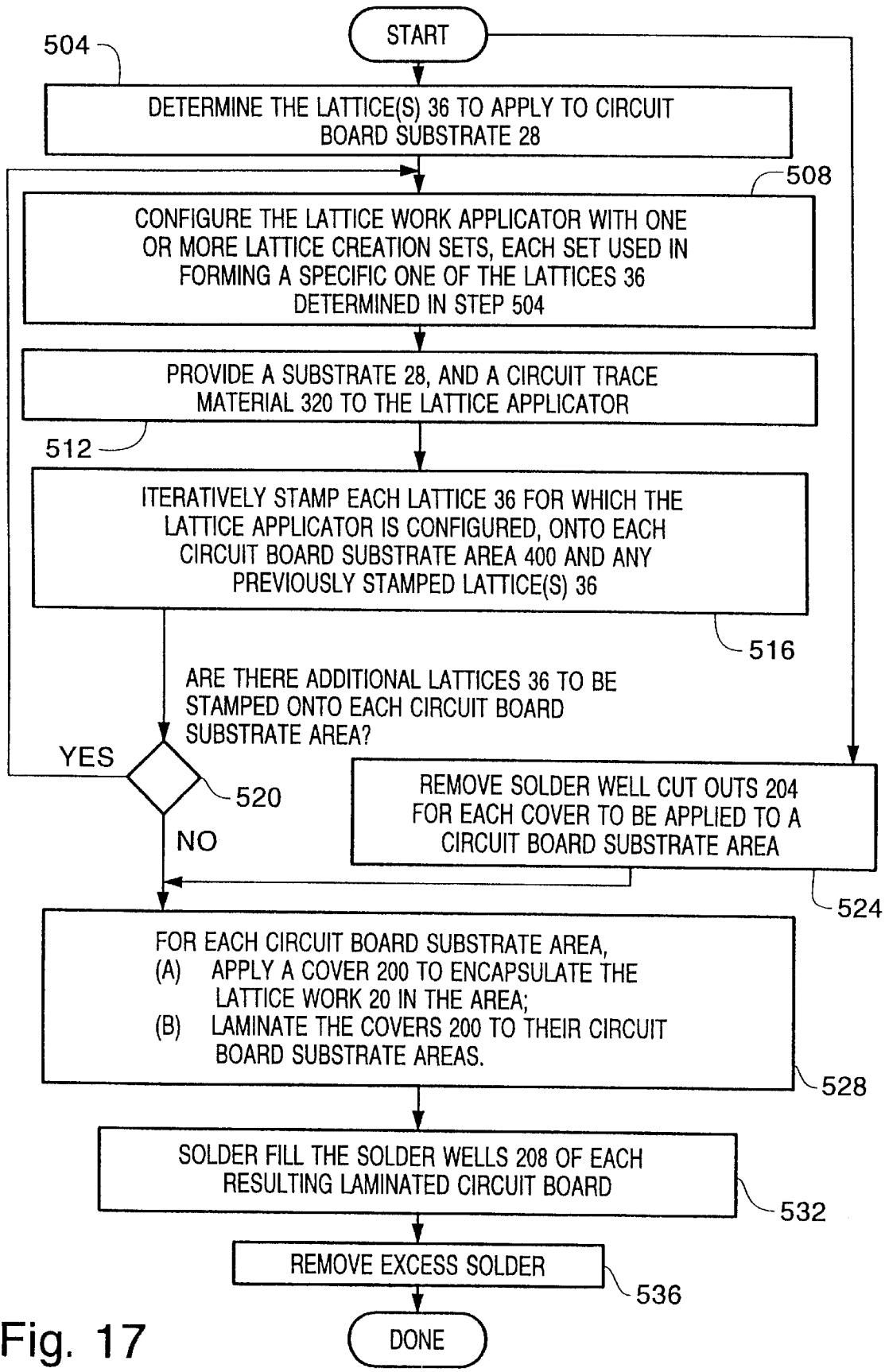
FIG. 17 is a flowchart of the steps performed in fabricating circuit boards.

The flowchart of FIG. 17 provides a high level description of the steps for the method of the present invention. Accordingly, once a latticework 20 for a circuit board 206 has been designed, in step 504 this latticework 20 is decomposed into lattices 36 for successive application to each circuit board substrate area 400. The determining of the lattices 36 in this step is substantially straightforward, i.e., a number of different and suitable layouts or designs can be used that can be provided by one of ordinary skill in the art.

Following step 504, in step 508, the one or more presses (which are herein collectively denoted as the latticework applicator) are configured with one or more of the lattice creation sets having a pressure plate 304 and die plate pair 312 through which corresponding punch elements 300 held to punch holder 302 are provided. Subsequently, in step 512, a circuit board substrate 28 and a lattice trace material 320 are provided to the circuit trace applicator for fabricating the circuit board circuitry upon the substrate. Thus, in step 516, each of the lattices 36 for which the lattice applicator is configured is sequentially stamped onto the circuit board areas of the substrate 28. Note that this step may provide only a single lattice 36 on each circuit board substrate area or a potentially large plurality of lattices 36 may be successively applied to each circuit board area. Subsequently, in step 520, a determination is made as to whether there are additional lattices 36 to be stamped onto each circuit board substrate area. For example, if five such lattices 36 are to be stamped onto each circuit board area and at most only two such lattices may be stamped in a single performance of step 516, then steps 508 through 520 will be iteratively performed three times.

In step 524, which may be performed asynchronously with steps 504 through 520, circuit board covers 200 have solder well openings 204 removed so that there is external access to the pads 40 provided in the bottom of each well 208.

Subsequently, when all lattices 36 of the latticework 20 have been applied to each circuit board substrate area and all circuit board covers 200 have had their openings 204 removed, in step 528, the covers 200 are provided on each circuit board substrate area and laminated to these areas using both pressure and heat. Note that in one embodiment of the lamination process, each covered circuit board substrate area is encapsulated within a rubber mold and heated to a temperature of 500° F. at a pressure of 15 psi. During the lamination process, resin in the cover 200 flows into the crevices surrounding the circuit traces 24 and thereby encapsulates them. Further, the pressure sensitive adhesive used in adhering the latticework 20 onto the circuit board substrate area is a dielectric material to avoid unwanted conducting among lattices 36.

With respect to the application of heat and pressure, it is essential that the cover material be flowable in a direction parallel or substantially parallel to the thickness or cross-section of the resulting latticework 20. No flow of the cover material, or substantially no flow thereof, should occur in directions that are non-parallel, such as in planes perpendicular to the plane of flow. If the parallel or substantially parallel flow is defined as being in a Z direction, then flow of such material is constrained so that the material does not move or flow in X and Y planes. Consequently, the flowable material does not move outwardly along different sections of the latticework. To achieve this, equal pressure is applied throughout the cover and latticework, while cover material flow is constrained in outward directions. In one embodiment, the cover material is not only associated with the cover 200 that is applied after all of the lattices 36 are in place, but the substrate 28 is also made of the same or similar material as the cover material so that substrate material flow occurs as well in the parallel or substantially parallel direction relative to the thickness or cross-section of the latticework 20.

In step 532, solder is provided in the solder wells 208 of each resulting laminated circuit board, as is well known in the art. As, for example, is taught in U.S. Pat. No. 4,985,601 by the same inventor as for the present invention. Lastly, in step 536, any excess solder remaining on the exterior of the covers 200 of the now laminated circuit boards is removed.

After the circuit boards 206 have been fabricated according to the flowchart of FIG. 17, various electrical components may be attached to the circuit boards. In particular, FIGS. 18A and 18B illustrate one embodiment of how electrical components may be attached to the circuit boards fabricated hereinabove. Accordingly, referring to FIG. 18A, leads 604 from, for example, an integrated circuit (not shown) may be positioned so that the free end of each lead contacts the bottom of a circuit board well 208. Note that within wells 208 as per step 532 of FIG. 17, a reflowable conductive material such as solder has been deposited, the solder being stylistically depicted in the wells of the present figure as the volumes labeled 608 and whose cross section is cross-hatched. Accordingly, once the free ends of the leads 604 have been positioned, the circuit board is heated so that the reflowable conductive material 608 melts within the wells 208 and subsequently flows about the free ends of the leads 604. Accordingly, FIG. 18B illustrates the results of the reflowable conductive material 608 contacting a lead 604. That is, the reflowable material surrounds the free end of the lead 604 and migrates some way up the lead. Thus, when the circuit board 206 is cooled, the leads 608 are fixedly attached in the wells 208 wherein the flowable material 608 provides conductivity between each lead 608 and the corresponding pad 40 in the bottom of the corresponding well.

It is important to note that the circuit boards fabricated hereinabove are substantially more resistant to heat damage than standard circuit boards such as, for example, FR4 standard epoxy glass circuit boards. That is, the circuit boards fabricated hereinabove may be exposed to temperatures as high as 400° F. without suffering damage wherein typical FR4 circuit boards may suffer damage at 135° F.

It is also important to note that by modifying the shape of the pressure and die plates, the present invention may be utilized for placing circuit board traces on a wide variety of objects heretofore not contemplated. That is, for example, by configuring the pressure and die plates so that instead of being flat, they have mating cylindrical shapes with the die plate 312 also having a correspondingly cylindrically shaped underside for mating with some portion of a cylindrical substrate, then a circuit board lattice 36 may be stamped onto such a cylindrical substrate. In particular, a lattice 36 may be stamped onto a cylindrical electromechanical actuator. Of course, other shapes and contours are also within the scope of the present invention, such as, for example, the interior contours of an auto body panel.

Although the preferred embodiment of the present invention has been described in the context of the fabrication of a circuit, it should be understood that the present invention is useful in a variety of applications. In products or processes where overlying or stacked lines of material are provided, the apparatus and methodology of the present invention can be incorporated. Relatedly, the stacked lines or traces need not be conductive.

The foregoing discussion of the invention has been presented for purposes of illustration and description. Further, the description is not intended to limit the invention to the form disclosed herein. Consequently, variation and modification commensurate with the above teachings, within the skill and knowledge of the relevant art, are within the scope of the present invention. The embodiment described hereinabove is further intended to explain the best mode presently known of practicing the invention and to enable others skilled in the art to utilize the invention as such, or in other embodiments, and with the various modifications required by their particular application or uses of the invention. It is intended that the appended claims be construed to include alternative embodiments to the extent permitted by prior art.

What is claimed is:

1. A method for making a latticework, comprising:
   providing a plurality of lattices of lines having lengths; and
   positioning a substrate relative to machinery used in applying said plurality of lattices of lines on said substrate, wherein at least portions of one of said plurality of lattices is in contact with portions of another of said plurality of lattices.

2. A method, as claimed in claim 1, wherein:
   said plurality of lattices includes a number of conducting traces and a number of pads electrically connected to said conducting traces.

3. A method, as claimed in claim 2, wherein:
   said providing step includes overlying a portion of a first conducting trace of a first lattice with a portion of a first conducting trace of a second lattice.

4. A method, as claimed in claim 3, wherein:
   said second lattice includes a first insulator joined to said first conducting trace of said second lattice and wherein said portion of said first conducting trace of said second lattice is insulated from said portion of said first conducting trace of said first lattice using said first insulator.

5. A method, as claimed in claim 3, wherein:
   said providing step includes overlying said portion of said first conducting trace of said first lattice with a portion of a first conducting trace of a third lattice.

6. A method, as claimed in claim 1, wherein:

said machinery includes a number of punch elements and said providing step includes causing said number of punch elements to move through a pressure plate and engage a material from which a first lattice is to be provided on said substrate.

7. A method, as claimed in claim 6, wherein:

said providing step includes using a die plate through which said first lattice moves before said first lattice contacts said substrate.

8. A method, as claimed in claim 1, wherein:

said machinery includes a first set of punch elements and a second set of punch elements and said providing step includes forming a first lattice on said substrate using said first set of punch elements, moving said substrate relative to said first set of punch elements and using said second set of punch elements to provide a second lattice on said substrate.

9. A method, as claimed in claim 1, wherein:

said machinery includes a first set of punch elements and a second set of punch elements and said providing step includes forming a first lattice on said substrate using said first set of punch elements and subsequently replacing said first set of punch elements with said second set of punch elements and then using said second set of punch elements to form a second lattice on said substrate.

10. A method, as claimed in claim 1, wherein:

said providing step includes providing a conductor material and insulator material joined to said conductor material and then forming a first lattice having a number of conducting traces formed using said conductor material with each of said conducting traces overlying an insulator formed using said insulator material.

11. A method, as claimed in claim 2, wherein:

said providing step includes exposing said pads while covering said conducting traces.

12. A method, as claimed in claim 1, further comprising:

applying heat and pressure to said plurality of lattices after a cover is joined to said plurality of lattices.

13. A method, as claimed in claim 12, wherein:

said applying step includes causing said cover material to flow and surround substantial portions of said lattices.

14. A method, as claimed in claim 13, wherein:

said applying step includes providing substantially equal pressure in a direction along the thicknesses of said lattices while said flowable cover material is substantially constrained from movement in directions away from the thicknesses of said lattices.

15. A method, as claimed in claim 1, wherein:

said machinery includes a pressure plate having a first set of cut-outs, a die plate having a second set of cut-outs and punch elements and said providing step includes locating said pressure plate and said die plate relative to said substrate, moving said punch elements through said first set of cut-outs and then moving a first lattice of lines through said second set of cut-outs of said die plate and in which said first set of cut-outs and said second set of cutouts are formed substantially at the same time before said locating step.

16. An apparatus including a plurality of lattices of lines having lengths, comprising:

a substrate;

a first lattice having a plurality of lines contacting said substrate; and a second lattice having a plurality of lines and in which a portion of a first line of said second lattice contacts a portion of a first line of said first lattice and other portions of said first line of said second lattice contact said substrate.

17. An apparatus, as claimed in claim 16, wherein:

all of said lines of all of said lattices are contained in substantially the same plane except where said lines contact other lines.

18. An apparatus, as claimed in claim 16, wherein:

said substrate has an outer surface and at least portions of said lengths of all of said lines of all of said lattices are in contact with said outer surface of said substrate.

19. An apparatus, as claimed in claim 16, wherein:

said first lattice includes a number of pads with each of said pads contacting said substrate and in which a cover member is used to cover said lines while exposing said pads.

20. An apparatus, as claimed in claim 16, wherein:

each of said lines of said second lattice includes a conductor, an insulator joined to said conductor and an adhesive joined to said insulator and in which a portion of one of said insulators overlies a portion of one of said conductors of said first lattice.

21. An apparatus, as claimed in claim 16, wherein:

a majority of said lines of said second lattice contact said substrate such that a space is defined between said majority of said lines of said second lattice and said lines of said first lattice.

22. An apparatus, as claimed in claim 19, wherein:

each of said pads are maintained free of overlying portions of conducting lines and other pads.

23. An apparatus, as claimed in claim 16, wherein:

said first lattice includes a number of pads and each of said lines of said first and second lattices includes conducting traces and all of said conducting traces either extend in contact with said substrate or overlie other conducting traces that contact said substrate.

* * * * *